(12) United States Patent
Rayssac et al.

(10) Patent No.: US 7,182,234 B2
(45) Date of Patent: Feb. 27, 2007

(54) SUBSTRATE CUTTING DEVICE AND METHOD

(75) Inventors: Olivier Rayssac, Grenoble (FR); Fabrice Letertre, Grenoble (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 106 days.

(21) Appl. No.: 10/883,435

(22) Filed: Jul. 1, 2004

(65) Prior Publication Data
US 2005/0000649 A1 Jan. 6, 2005

Related U.S. Application Data

(63) Continuation of application No. PCT/FR03/00002, filed on Jan. 2, 2003.

(30) Foreign Application Priority Data
Jan. 3, 2002 (FR) .................... 02 00028

(51) Int. Cl.
*B26F 3/00* (2006.01)

(52) U.S. Cl. .............. 225/2; 29/762; 83/177; 83/870; 156/344; 156/584; 225/105; 438/455; 438/458

(58) Field of Classification Search .......... 225/2, 225/105; 156/344, 584, 254, 510; 438/458, 438/455; 29/239, 762; 83/51, 177, 870
See application file for complete search history.

(56) References Cited

U.S. PATENT DOCUMENTS

| | | | |
|---|---|---|---|
| 5,368,291 A * | 11/1994 | MacNiel | 271/308 |
| 5,374,564 A | 12/1994 | Bruel | 437/24 |
| 6,221,740 B1 * | 4/2001 | Bryan et al. | 438/458 |
| 6,318,222 B1 * | 11/2001 | Weinman, Jr. | 83/13 |
| 6,382,292 B1 * | 5/2002 | Ohmi et al. | 156/584 |
| 6,418,999 B1 | 7/2002 | Yanagita et al. | 156/584 |
| 6,653,205 B2 * | 11/2003 | Yanagita et al. | 438/455 |
| 6,653,206 B2 * | 11/2003 | Yanagita et al. | 438/458 |
| 6,752,053 B2 * | 6/2004 | Rubicam | 83/13 |
| 2004/0144487 A1 * | 7/2004 | Martinez et al. | 156/344 |

* cited by examiner

*Primary Examiner*—Boyer D. Ashley
*Assistant Examiner*—Carolyn Blake
(74) *Attorney, Agent, or Firm*—Winston & Strawn LLP

(57) ABSTRACT

An automatic cutting device is described for cutting an assembly. The assembly includes a material having a weakened zone therein that defines a useful layer and being attached to a source substrate. The cutting device includes a cutting mechanism and a holding and positioning mechanism operatively associated with the cutting mechanism. The holding and positioning mechanism positions the material so that the cutting mechanism detaches the layer from the source substrate along the weakened zone. The cutting device also includes a control mechanism for adjusting at least two different portions of the assembly during detachment of the layer to facilitate a more precise detachment.

15 Claims, 3 Drawing Sheets

FIG_1

SUBSTRATE CUTTING DEVICE AND METHOD

CROSS-REFERENCE TO RELATED APPLICATIONS

This application is a continuation of International application no. PCT/FR03/00002 filed Jan. 2, 2003, the entire contents of which are expressly incorporated herein by reference thereto.

BACKGROUND ART

The present invention generally relates to the processing of materials, and more specifically processing substrates for electronics, optics or optoelectronics. In particular, the invention relates to a high-precision automatic cutting device for cutting an assembly that includes a layer of material having a weakened zone which is attached to a source substrate. The device includes cutting means and holding means.

The invention also relates to a high-precision automatic cutting method, wherein an assembly that includes a layer of material attached to a source substrate is detached via a weakened zone. The method includes holding the assembly with a holding means, and cutting the assembly to detach the layer from the source substrate with a cutting means. It should be noted that the invention is particularly suitable for cutting layers having a thickness less than approximately one hundred microns, and in particular for cutting "thin" or useful layers, having a thickness on the order of one micron.

It should be noted that the term "cutting" when used herein means dividing a single item or assembly into two distinct parts such that the parts are not joined again. As discussed below, such cutting within the scope of the invention is conducted on a weakened zone.

Devices and methods are used to form layers (thin or not), which may be transferred from the source substrate to a "target" substrate. The substrates generally come in the form of disks generally referred to in the field as "wafers". The wafers may be made of a semi-conductor material such as silicon.

A person skilled in the art knows how to form a weakened zone inside a wafer along a plane that is parallel to the main faces of the wafer. For example, the weakened zone may be produced by implanting ions through the surface of the wafer. The ions create a weakened layer in the volume of the wafer that delimits a lower region (which corresponds within the scope of this text to the source substrate) and an upper region adjacent to the ion source (which corresponds to the layer to be cut). An example of such a method used to produce thin layers is found in U.S. Pat. No. 5,374,564.

It is also possible to produce the weakened zone by other known means, for example, by constructing an intermediate region of porous material between two regions of dense material. An embedded oxide layer could be formed in a substrate (e.g. an Silicon On Insulator (SOI) type substrate) or by adhering two layers together, wherein the adhesion zone corresponds to the weakened zone.

It should also be noted that it is possible to process SOA (Silicon On Anything) type substrates or even AOA (Anything On Anything) type substrates in this manner. Thus, the cutting of such substrates falls within the scope of the invention.

To implement cutting along the weakened zone and to thus divide the source substrate and the layer of material into two distinct parts, it is possible to use a manual operator. However, using a manual operator limits the layer production output. In addition, such operations may not be reproducible. Automatic cutting devices and methods aiming to do away with the abovementioned drawbacks are known. An example of such a device and method is disclosed in U.S. Pat. No. 6,418,999. The device according to this patent uses a water jet to impact a slice of a wafer which is held on its two main faces, wherein the water jet engages a weakened zone and divides the wafer into two parts. This device includes holding means associated with the two respective faces of the wafer, and the holding means enables a certain predetermined separation to occur between the two parts of the wafer during cutting.

It is important to manage the separation between the two parts of the wafer located on either side of the weakened zone with precision, particularly when these two parts are made of different materials. For example, when cutting an assembly including a layer of silicon attached to an SiC substrate via a weakened zone, the silicon layer undergoes significant deformation (the SiC substrate being considerably more rigid and undergoing considerably less deformation), which may cause damage to the silicon layer.

The device disclosed in U.S. Pat. No. 6,418,999 attempts to provide a solution to accompany separation and/or deformation of the two parts of the wafer in the desired manner. However, one restriction associated with this device is that it includes only passive means to enable a specific separation and/or a specific deformation. The passive means correspond to specific configurations of the holding means, wherein the surface may include cavities of given geometries to enable a specific spacing between the parts of the wafer. It is also possible, according to this document, to give the surface of the holding means a generally convex shape, or to provide a layer of elastic material on the surface of the holding means which contacts the wafer. But such passive solutions cannot be used to accompany the separation or spacing apart and/or deformation of the parts of the wafer because there is no actual control (i.e. control in active mode) carried out by the device disclosed in U.S. Pat. No. 6,418,999. In addition, it should be noted that the holding means must also rotate the wafer so that the entire periphery of the wafer is engaged by a water jet, which complicates the design and operation of the device.

SUMMARY OF THE INVENTION

Presented is an automatic cutting device for cutting an assembly. The assembly includes a material having a weakened zone therein that defines a useful layer and being attached to a source substrate. The cutting device includes a cutting mechanism and a holding and positioning mechanism operatively associated with the cutting mechanism. The holding and positioning mechanism positions the material so that the cutting mechanism detaches the layer from the source substrate along the weakened zone. The cutting device also includes a control mechanism for adjusting at least two different portions of the assembly during detachment of the layer to facilitate a more precise detachment.

In an advantageous embodiment, the cutting mechanism includes a blade for contacting the assembly. The cutting mechanism may also include means for generating a pressurized fluid jet. In a preferred embodiment, the cutting mechanism includes two blades. In a beneficial implementation, the cutting mechanism includes at least one blade having a leading edge with a crescent-shaped profile for engaging a periphery of the assembly.

In an advantageous implementation, the holding and positioning mechanism is moveable to induce strains in the assembly to facilitate cutting. In addition, the holding and positioning mechanism could include at least two grippers associated with at least two different portions of the assembly. In a beneficial implementation, the holding and positioning mechanism is controllable in a direction perpendicular to a cutting plane. The holding and positioning mechanism may also be controllable in a direction parallel to a cutting plane.

An advantageous implementation of the invention includes a sensor capable of acquiring a representative data item corresponding to the progress of a cutting operation. A control loop may also be used for utilizing the representative data to control the movements of the holding and positioning mechanism. In a preferred embodiment, the sensor means comprises light-emitting diodes arranged on either side of the assembly for generating data concerning the progress of the detachment of the layer from the source substrate.

Another aspect according to the invention concerns a method for automatically cutting an assembly that includes a material having a weakened zone therein that defines a useful layer, and being attached to a source substrate. The method includes positioning the assembly with a holding and positioning mechanism, and cutting the assembly with a cutting mechanism while concurrently controlling the movement of the holding and positioning mechanism such that the layer is detached from the source substrate along the weakened zone. At least two different portions of the assembly are adjusted during detachment of the layer to facilitate a more precise detachment.

In a preferred implementation, the movement of the holding and positioning mechanism is controlled in conjunction with contacting the assembly with the cutting means. Advantageously, the method includes acquiring at least one data item representative of the progression of the cutting operation, and controlling the movement of the holding and positioning mechanism based on the data item. In a preferred embodiment, the method includes controlling the movement of the holding and positioning mechanism in a direction parallel to a cutting plane of the assembly. In addition, the method beneficially includes controlling the movement of the holding and positioning mechanism in a direction perpendicular to a cutting plane of the assembly.

The invention thus makes it possible to carry out entirely automated cutting operations.

BRIEF DESCRIPTION OF THE DRAWINGS

Other aspects, purposes and advantages of the invention will become clear after reading the following detailed description with reference to the attached drawings, in which.

DETAILED DESCRIPTION OF THE PREFERRED EMBODIMENTS

Figure 1:
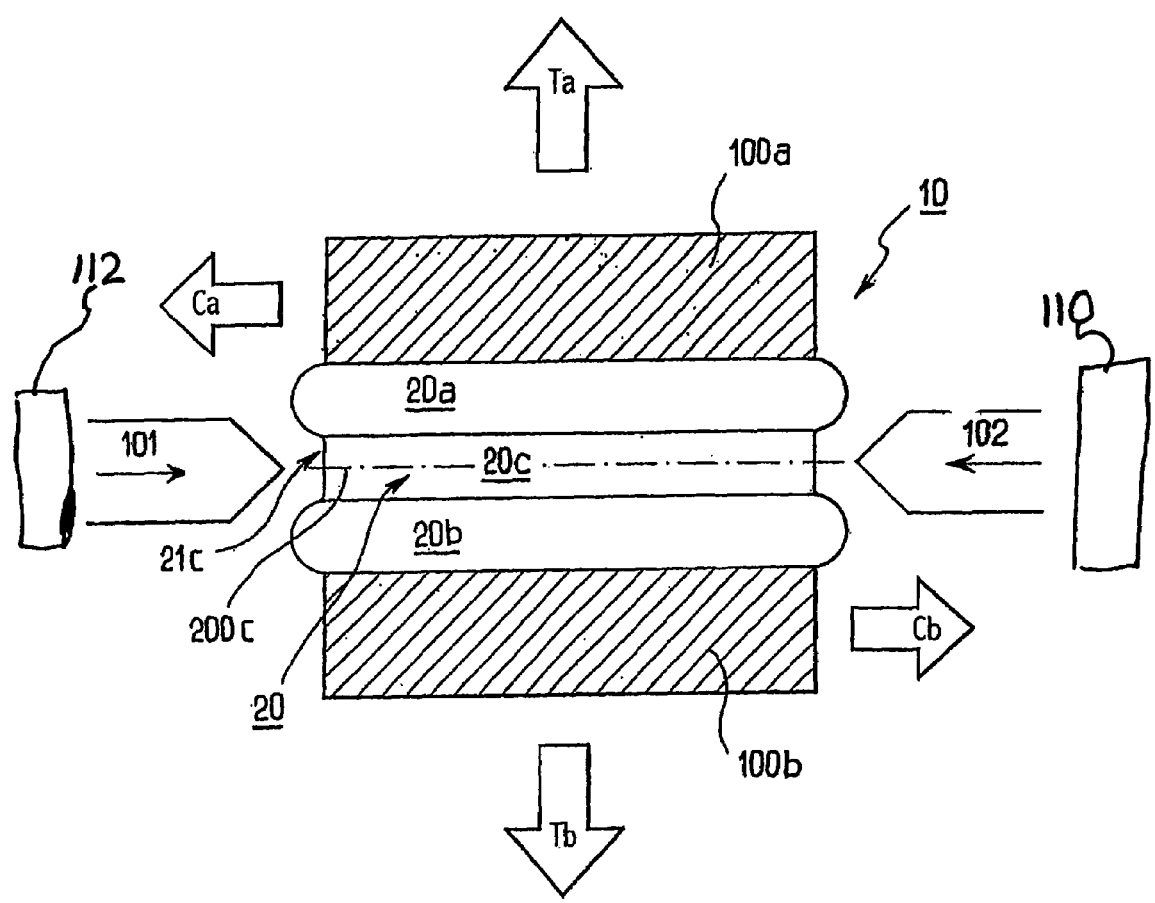
FIG. 1 is a simplified schematic side view of a cutting device according to the invention.

With reference to FIG. 1, a cutting device 10 and a wafer 20 forming a cutting assembly are schematically represented. It should be noted that, while in the simplified schematic representations in the figures the wafer 20 is represented with an apparently significant thickness, in reality the wafer may be extremely thin. Typically, the wafer may have a thickness of a few millimeters, and a diameter which may be on the order of 20 to 30 centimeters (these values are exemplary only, and are not meant to limit the invention in any manner).

The wafer 20 consists of two parts 20a and 20b having a generally disk shape. An intermediate region 20c extends between the two parts 20a and 20b and includes a weakened zone 200c. The weakened zone 200c generally extends along a plane that is parallel with the main faces of the wafer. The weakened zone may, as mentioned in the background section, have been produced by implantation of ions, but also may be formed by any other means known in the art. It should be noted that the two parts 20a and 20b may be made of the same material (particularly in the case where the weakened zone 200c is formed by implantation of atomic species), or may be made of different materials. By convention, the term "source substrate" refers to the bottom part 20b of the wafer, and the term "cutting layer" refers to the top part 20a.

As shown in FIG. 1, the edges of the two parts 20a and 20b may be rounded or chamfered, which is standard practice particularly for layers of semiconductor material. In this case, the two parts 20a and 20b define an annular chamfer 21c on the intermediate region 20c. However, it is also possible for the edges of the parts 20a and 20b to all have another given geometry.

The device 10 includes at least one blade to contact or engage the wafer 20 at its weakened zone 200c. In the specific example represented in FIGS. 1 and 2, the device 10 comprises two blades 101 and 102 arranged in the plane of the weakened zone 200c (referred to hereinafter as the "cutting plane"), and a holding means. The two blades are diametrically opposed to each other at either end of the wafer so as to engage it on opposite sides of its periphery. However, it is also possible to produce the device 10 with only one blade, because it is possible to simply remove one of the two blades or to replace a blade with a fixed wedge to help hold the wafer in position during cutting (this holding function being conducted elsewhere as described below).

In an implementation of the invention, the holding means are in the form of two grippers 100a and 100b that are associated with opposite external faces of the respective parts 20a and 20b of the wafer 20. The grippers 100a and 100b each comprise gripping means for gripping one of the faces of the wafer. The gripping means may, for example, comprise suction cups and/or surface cavities on the gripper which are for use in contacting the wafer. In an implementation, it is possible to evacuate the cavities to attach the gripper and a surface of the wafer. The gripping means may also be produced in any form known in the art, allowing them to grip a wafer surface by providing a sufficient level of cohesion between the gripper and its associated wafer part so as to rigidly hold the assembly during the entire cutting operation (including during the engagement of the blade which is described in detail below). Each of the two grippers 100a and 100b is also mounted on respective movement means, capable of moving an associated gripper in the cutting plane and in a "vertical" direction that is perpendicular to the cutting plane. The gripper movement means are not represented in the figures for simplification and clarity purposes. It should be noted, however, that the movement means are capable of controlling the movement of each gripper independently of the other gripper.

In an implementation, control means are associated with each blade of the device to control the movement of the blade in the cutting plane, as the blade is moved from the outside of the wafer towards it center. It should be noted that while the blades have been represented in the figures with a significant apparent thickness, as mentioned above concerning the wafer itself, the blades are very thin in reality (on the order of one millimeter). The blade engages the periphery of the wafer at the weakened zone without necessarily penetrating to the center of the wafer.

Figure 2:
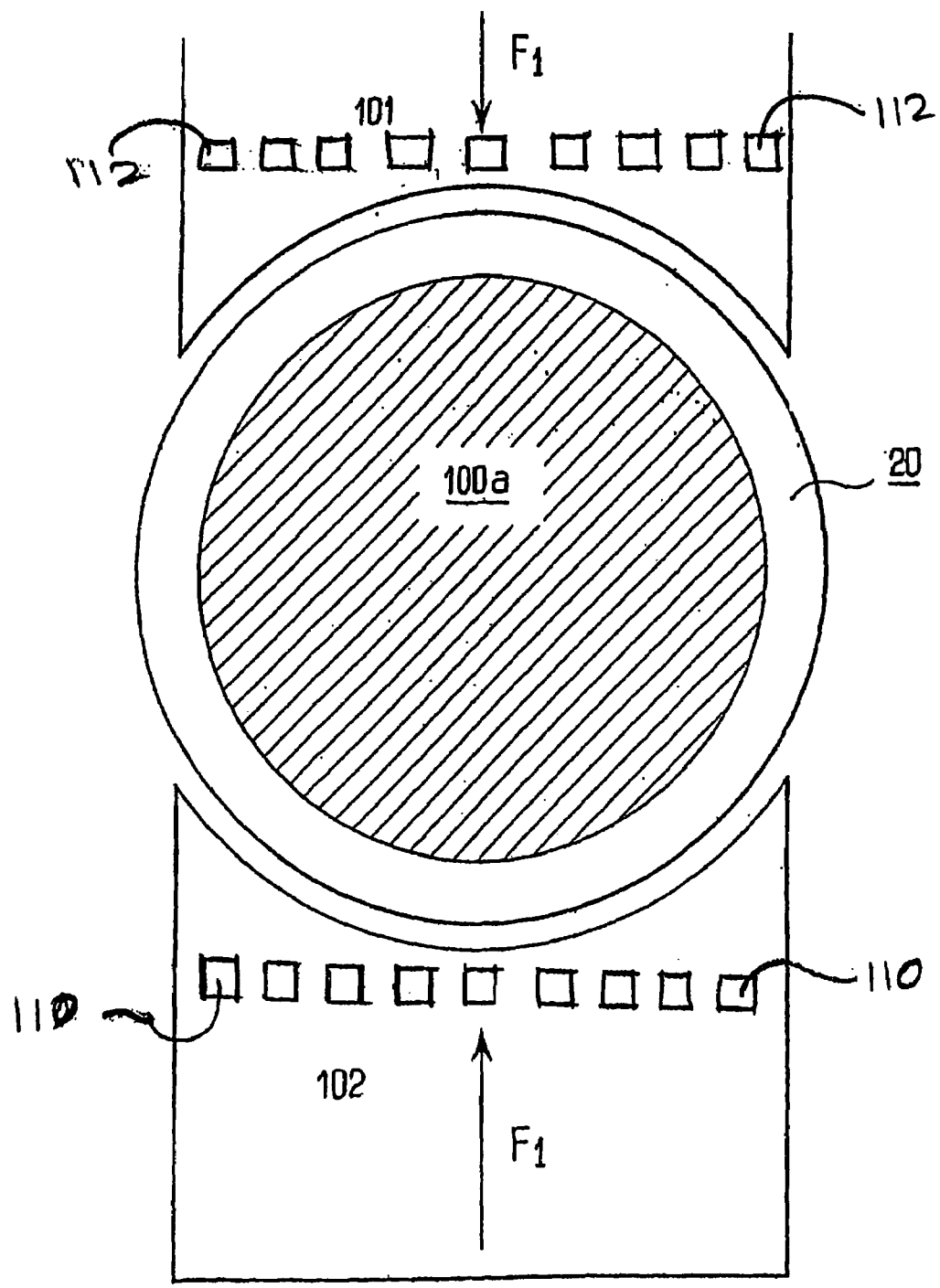
FIG. 2 is a simplified schematic top view of the device of FIG. 1.

As shown in the top view of FIG. 2, in an implementation the blades have a crescent-shaped leading edge wherein the concavity corresponds to the curvature of the periphery of the wafer, so as to engage a significant part of the periphery. It is also possible to provide for a main blade to contact the wafer to initialize the cutting operation by generating a detachment front which is propagated between the two parts 20a and 20b. Two other blades could then be used to engage the wafer, taking over from the main blade. These two blades could be positioned symmetrically on either side of the wafer with respect to the direction of engagement of the first blade.

In any case, irrespective of the number of blades used in an embodiment of the device and their particular movement kinematics, the movement of the grippers is also controlled in conjunction with the engagement of the blades into the wafer. It is the specific combination of the means mentioned above (blade(s) and grippers) which makes it possible to cut the wafer under optimal conditions. More specifically, it is the combination of the action of each blade of the device and the grippers which act on the two external faces of the wafer, which makes it possible to carry out effective cutting of the wafer. In particular, the movement of each blade is controlled so that a blade engages the wafer at its weakened zone 200c, in conjunction with controlling the movement of each gripper according to predetermined kinematics. It is noted that the it is possible for the movement kinematics of the two grippers to be different while being synchronized with each other.

Figure 3:
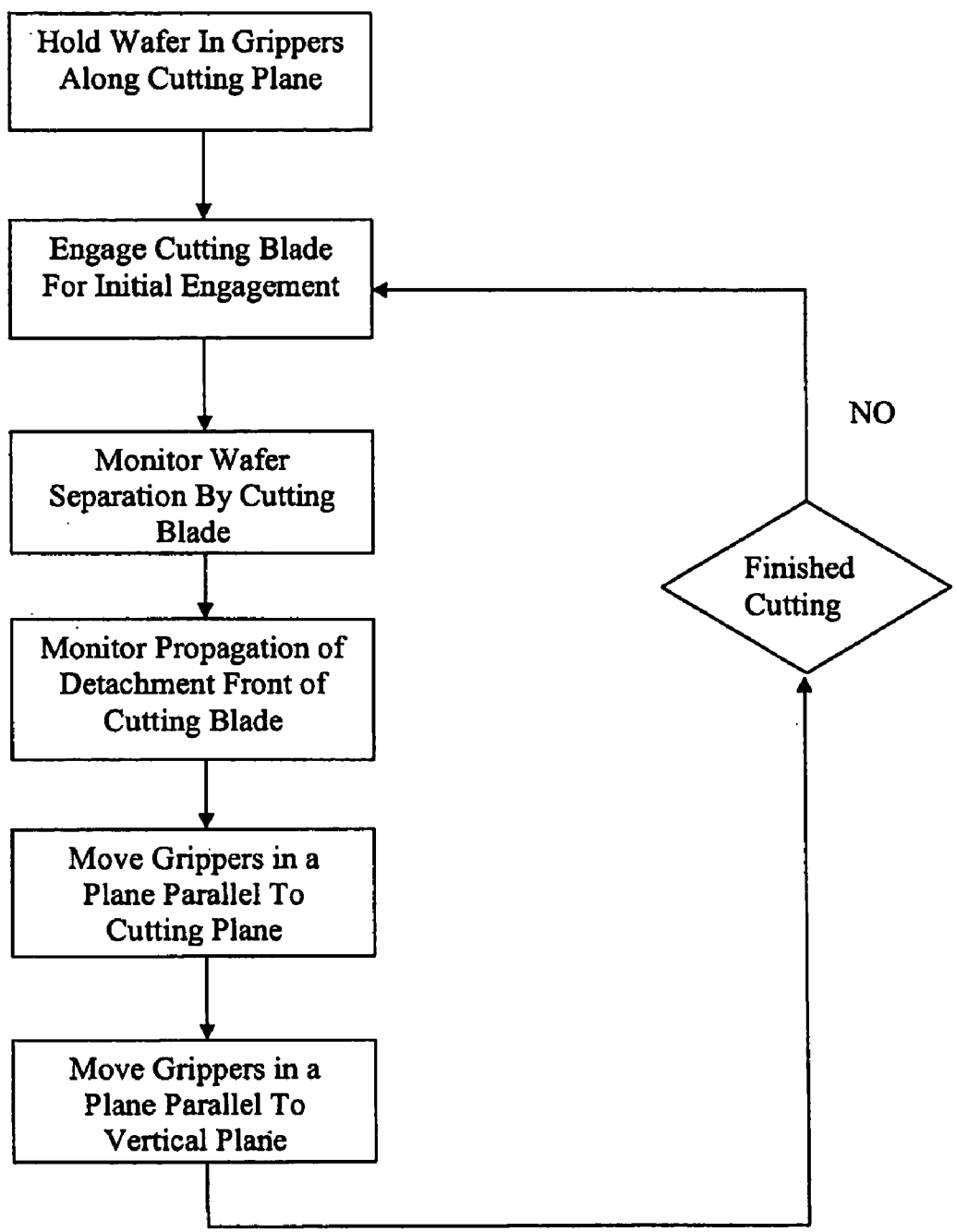
FIG. 3 is a flow chart of a control loop of the device of FIG. 1.

Therefore, the grippers carry out the following functions, in conjunction with the engagement of wafer by the blade(s), as shown in FIG. 3. First, the grippers hold their associated wafer part in the cutting plane, such that the position of the wafer is controlled in the cutting plane during engagement of the blade(s). This control of the position of the parts of the wafer may, for example, be conducted by immobilizing the parts of the wafer during a specific cutting phase, particularly during the initial engagement of the wafer by the blade. The grippers thus form holding means for the wafer, which enable the blades to engage the wafer under optimal conditions. Second, the grippers are moved in a controlled manner in the cutting plane, and/or in the vertical direction. The primary effect of controlling the movement of the parts of the wafer in the vertical direction is to accompany, in a controlled and active manner, the deformation of the parts of the wafer that results from the engagement of the blade(s) and the propagation of a detachment front between the material layer and the source substrate. It is possible to observe or monitor the propagation of the detachment front and control the movement of the grippers in a direction away from the wafer surfaces (in a vertical direction) as the detachment front progresses by using a suitable control loop.

It should be noted that, with a view to a fully automated device with high reliability and durability qualities, a preferred solution consists of controlling the movement of the grippers (both vertically and in the cutting plane as described below) not by observing the propagation of a detachment front, but by monitoring the spacing between the two parts of the wafer. A description of a simple means used to effectively monitor the separation is given below. In this case, the control loop which is used to control the movement of each gripper is controlled by the separation or spacing apart observations from such means. In this way, active control is conducted concerning the separation and/or deformation of the parts of the wafer being cut. This arrangement is advantageous, particularly in contrast to the means disclosed by U.S. Pat. No. 6,418,999 which are purely passive and are subjected to the deformation of the parts of the wafer without actively influencing the deformation.

More specifically, the controlled movement of the parts of the wafer along the vertical direction may be used to correct for the deformation and/or spacing of the parts of the wafer during cutting. For example, if the deformation and/or spacing monitored (by a specially adapted camera, or for example, by any optical system and a specific development is discussed below) does not correspond to desired conditions (the observed values of deformation of and/or spacing between wafer parts are too low, or are too high, or are not progressing in the desired manner) then corrective movements are conducted. Each wafer part 20a or 20b could be moved to obtain such corrections, and each part may be moved independently from the other part. Also, the movements of the wafer parts may not necessarily be symmetric (particularly if the two parts are made of different materials that have different mechanical characteristics). In this manner, it may be possible to keep one of the grippers immobile because of the characteristics of the wafer (particularly due to the nature of the materials forming the two parts of the wafer), while controlling only the movement of the other gripper.

It should be noted that, if a required control means is designed to control the movements of each gripper, the surface of the grippers which contact an associated wafer face may be of any desired shape, such as a shape that is suitable for favoring a particular type of deformation (for example, a convex shape, a gripper surface comprising cavities or channels, and the like).

In addition to the control of the deformation and/or spacing between the parts of the wafer during cutting, the movements of the grippers in the vertical direction may also be controlled to induce a tensile strain in the wafer (along the arrows Ta and Tb shown in FIG. 1), so as to further favor cutting. It is also noted that the gripping means associated with each gripper guarantees a rigid connection between each gripper and its associated wafer part, such that each gripper subjects each wafer part to tensile strain. It is also possible, in combination with the above arrangements, to control movement of the grippers in the cutting plane. For example, the grippers could be moved along opposite and possibly alternative trajectories, to induce a shearing strain between the two parts of the wafer. This also would favor cutting. This shearing effect is represented in FIG. 1, shown by the arrows Ca and Cb which represent the opposite strains applied to both respective parts of the wafer, parallel to the cutting plane, but in opposite directions.

The cohesive force between each gripper and its associated wafer part is sufficient for the gripper to remain completely attached to its associated wafer part during various movements. In this manner, the invention offers a completely original combination of cutting means, and holding means capable of being moved in a controlled manner. This arrangement makes it possible to combine the advantages of the engagement of an assembly to be cut by a blade, which acts as a "wedge" inserted between the two parts of the wafer. The arrangement thus favors the generation of a detachment front under the effect of the grippers which induce strains in the wafer.

It should be noted that the blade(s) of the device may be replaced by another type of cutting means, so long as the effect is combined with that of the holding means represented by the grippers. The cutting means may thus be means enabling the generation of a pressurized fluid jet, which is targeted at the weakened zone of the wafer. In addition, it is possible to provide a cutting means associated with the grippers that combines at least one blade and means used to generate such a pressurized fluid jet. Therefore, at least one blade of the device may include an internal pressurized fluid supply channel, wherein the channel opens onto the tip of the leading edge of the blade to enable the projection of the fluid on the weakened zone of the wafer in combination with the blade engagement.

All the arrangements mentioned above with respect to the control of the position and movement of the grippers, and therefore the associated wafer parts, will preferentially be implemented in combination with a system to monitor the deformation and/or spacing apart of the parts of the wafer. More specifically, in order to provide a reliable and robust automatic device, an advantageous solution is to select direct viewing means to monitor the spacing as the parts of the wafer separate during cutting. It will thus be possible to arrange a series of light-emitting diodes in the cutting plane on either side of the wafer, with respect to the general direction of engagement of the blade(s) of the device (therefore with respect to the general direction of propagation of the detachment front). The series of light-emitting diodes extend along the general direction of engagement of the blades (in the direction of the arrows F1 of FIG. 2). In an implementation, the diodes are arranged in pairs on either side of the general direction of engagement of the blade(s), each diode from a given pair being opposite the other. As can be seen in FIG. 1 and FIG. 2. a diode 110 from each pair thus emits a light beam towards another diode 112, which receives the beam in the absence of obstacles between the two diodes. Thus, when the parts of the wafer, normally inserted between the two diodes from each pair, are sufficiently separated (due to cutting), the beam emitted by the emitting diode 110 is received by the receiving diode 112.

By arranging the pair of diodes in the general direction of engagement of the blade(s) of the device, and by connecting each receiving diode to a central monitoring unit equipped with a processor, it is possible to monitor the progression of the separation or spacing apart of the parts of the wafer, and to then control the movement of the grippers accordingly.

It should be noted that it is possible to adapt the respective kinematics governing the effect of the cutting means and of the grippers, to adapt the mechanical strains applied between the two parts of the wafer in an optimal fashion, according to the characteristics of the wafer (for example, according to the nature of the materials forming the two parts of the wafer, and the like).

As a general rule, it is thus important for the controlled movements of the grippers to be carried out in conjunction with, or in combination with, the engagement of the wafer by the cutting means. The term "in conjunction" generally refers to the combination of the effect of both types of means. Thus, in an alternative embodiment of the invention, it is possible to control the contact of the cutting means (blade(s) or other cutting means) with the weakened zone of the wafer, after which the grippers are initialized to make use of the initial separation or spacing apart between the parts of the wafer caused by the "wedge" effect of the cutting means. However, in another alternative embodiment, it is possible to first cause separation of both parts of the wafer by applying opposite tensile forces by movement of the grippers on both respective parts, before initializing the cutting means.

What is claimed is:

1. A method for automatically cutting an assembly that includes a material having a weakened zone therein that defines a useful layer and being attached to a source substrate, comprising:
   positioning the assembly with a holding and positioning mechanism; and
   cutting the assembly with a cutting mechanism while concurrently controlling the movement of the holding and positioning mechanism such that the layer is detached from the source substrate along the weakened zone, wherein the holding and positioning mechanism comprises at least two grippers disposed on opposite sides of a cutting plane and associated with the at least two different portions of the assembly, and each gripper is independently movable both in a direction parallel to a cutting plane of the assembly and in a direction perpendicular to the cutting plane to facilitate a more precise detachment of the useful layer.

2. The method of claim 1, wherein the movement of the holding and positioning mechanism is controlled in conjunction with contacting the assembly with the cutting mechanism.

3. The method of the claim 1, further comprising acquiring at least one data item representative of the progress of cutting, and controlling the movement of the holding and positioning mechanism based on the data item.

4. The method of claim 1, wherein the controlling is achieved with the use of a control mechanism for adjusting movement in both the parallel and perpendicular directions during detachment of the layer to facilitate a more precise detachment.

5. The method of claim 1, wherein the cutting mechanism comprises a blade for contacting the assembly.

6. The method of claim 5, wherein at least two cutting blades are provided.

7. The method of claim 5, wherein the at least one blade having a leading edge with a crescent-shaped profile for engaging a periphery of the assembly.

8. The method of claim 1, wherein the cutting mechanism comprises a pressurized fluid jet.

9. The method of claim 1, wherein the holding and positioning mechanism is moveable to induce strains in the assembly to facilitate cutting.

10. The method of claim 1, wherein each gripper comprises a suction cup for holding a wafer surface and wherein the grippers can move in directions parallel and perpendicular to the weakened zone.

11. The method of claim 1, which further comprises acquiring a representative data item corresponding to the progress of a cutting operation.

12. The method of claim 11, wherein the representative data is acquired by a sensor.

13. The method of claim 12, wherein the sensor comprises light-emitting diodes arranged on either side of the assembly for generating data concerning the progress of the detachment of the layer from the source substrate.

14. The method of claim 11, which further comprises utilizing the representative data to control the movements of the holding and positioning mechanism.

15. The method of claim 11, wherein a control loop is provided for controlling the movements of the holding and positioning mechanism.

* * * * *